US010170193B2

(12) United States Patent
Tanzawa

(10) Patent No.: US 10,170,193 B2
(45) Date of Patent: *Jan. 1, 2019

(54) APPARATUS AND METHODS OF OPERATING MEMORY FOR NEGATIVE GATE TO BODY CONDITIONS

(71) Applicant: MICRON TECHNOLOGY, INC., Boise, ID (US)

(72) Inventor: Toru Tanzawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/935,126

(22) Filed: Mar. 26, 2018

(65) Prior Publication Data

US 2018/0211711 A1 Jul. 26, 2018

Related U.S. Application Data

(63) Continuation of application No. 15/638,718, filed on Jun. 30, 2017, now Pat. No. 9,953,711, which is a (Continued)

(51) Int. Cl.
*G11C 16/06* (2006.01)
*G11C 16/14* (2006.01)
(Continued)

(52) U.S. Cl.
CPC .......... *G11C 16/14* (2013.01); *G11C 16/0483* (2013.01); *G11C 16/08* (2013.01); *G11C 16/16* (2013.01); *G11C 16/3445* (2013.01)

(58) Field of Classification Search
CPC ........................ G11C 16/14; G11C 16/0483
See application file for complete search history.

(56) References Cited

U.S. PATENT DOCUMENTS 7,450,421 B2 11/2008 Mokhlesi et al.
7,505,323 B2 3/2009 Nguyen et al.
(Continued)

OTHER PUBLICATIONS

R. Katsumata, et al., "Pipe-shaped BiCS Flash memory with 16 Stacked Layers and Multi-Level-Cell Operation for Ultra High Density Storage Devices," 2009 Symposium on VLSI Technology Digest of Technical Papers, Jun. 2009, pp. 136-137.
(Continued)

*Primary Examiner* — Pho M Luu
(74) *Attorney, Agent, or Firm* — Dicke, Billig & Czaja, PLLC

(57) ABSTRACT

Methods of operating a memory, and apparatus so configured, include applying a first voltage level to a first voltage node connected to a first end of a string of series-connected memory cells, applying a second voltage level to a second voltage node connected to a second end of the string, applying a third voltage level less than the first and second voltage levels to a control gate of a first memory cell of the string while applying the first and second voltage levels to the first and second voltage nodes, and applying a fourth voltage level less than the third voltage level to a control gate of a second memory cell of the string while applying the third voltage level to the control gate of the first memory cell, wherein the first memory cell is closer to the first voltage node than the second memory cell.

22 Claims, 14 Drawing Sheets

Related U.S. Application Data continuation of application No. 15/166,613, filed on May 27, 2016, now Pat. No. 9,711,228.

(51) Int. Cl.
*G11C 16/04* (2006.01)
*G11C 16/34* (2006.01)
*G11C 16/08* (2006.01)
*G11C 16/16* (2006.01)

(56) References Cited

U.S. PATENT DOCUMENTS

| | | | |
|---|---|---|---|
| 7,742,338 B2 * | 6/2010 | Santin | G11C 16/3418 365/185.03 |
| 8,116,132 B2 | 2/2012 | Im | |
| 8,120,960 B2 | 2/2012 | Varkony | |
| 8,174,903 B2 * | 5/2012 | Han | G11C 16/0483 365/185.22 |
| 8,422,297 B2 | 4/2013 | Tamada | |
| 8,854,893 B2 | 10/2014 | Lee et al. | |
| 8,953,359 B2 | 2/2015 | Shuto et al. | |
| 9,165,651 B2 | 10/2015 | Hosono | |
| 9,202,575 B2 | 12/2015 | Yamamoto et al. | |
| 9,520,195 B2 * | 12/2016 | Chen | G11C 7/08 |
| 9,711,228 B1 * | 7/2017 | Tanzawa | G11C 16/14 |
| 9,953,711 B2 * | 4/2018 | Tanzawa | G11C 16/0483 |
| 2013/0273700 A1 | 10/2013 | Rabkin et al. | |

OTHER PUBLICATIONS

J. Jang, et al., "Vertical Cell Array using TCAT (Terabit Cell Array Transistor) Technology for Ultra High Denisty NAND Flash Memory," 2009 Symposium on VLSI Technology Digest of Technical Papers, Jun. 2009, pp. 192-193.

J. Kim, et al. "Novel Vertical-Stacked-Array-Transistor (VSAT) for ultra-high-density and cost-effective NAND Flash memory devices and SSD (Solid State Drive)," 2009 Symposium on VLSI Technology Digest of Technical Papers, Jun. 2009, pp. 186-187.

W. Kim, et al., "Multi-Layered Vertical Gate NAND Flash Overcoming Stacking Limit for Terabit Density Storage," 2009 Symposium on VLSI Technology Digest of Technical Papers, Jun. 2009, pp. 188-189.

J. Choi, et al., "3D Approaches for Non-volatile Memory," 2011 Symposium on VLSI Technology Digest of Technical Papers, Jun. 2011, pp. 178-179.

T. K. Park, et al., "Three-Dimensional 128Gb MLC Vertical NAND Flash-Memory with 24-WL Stacked Layers and 50MB/s High-Speed Programming", 2014 IEEE International Solid-State Circuits Conference, Feb. 2014, pp. 334-335.

* cited by examiner

APPARATUS AND METHODS OF OPERATING MEMORY FOR NEGATIVE GATE TO BODY CONDITIONS

RELATED APPLICATION

This application is a Continuation of U.S. patent application Ser. No. 15/638,718, titled "METHODS OF OPERATING MEMORY UNDER ERASE CONDITIONS," filed Jun. 30, 2017, now U.S. Pat. No. 9,953,711 issued on Apr. 24, 2018, which is a Continuation of U.S. patent application Ser. No. 15/166,613, titled "APPARATUS AND METHODS OF OPERATING MEMORY WITH ERASE DE-BIAS," filed May 27, 2016, now U.S. Pat. No. 9,711,228 issued on Jul. 18, 2017 which are commonly assigned and incorporated herein by reference.

TECHNICAL FIELD

The present disclosure relates generally to memory and, in particular, in one or more embodiments, the present disclosure relates to apparatus and methods of operating memory with erase de-bias.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select transistors, e.g., a source select transistor and a drain select transistor. Each source select transistor is connected to a source line, while each drain select transistor is connected to a data line, such as column bit line. A "column" refers to a group of memory cells that are commonly coupled to a local data line, such as a local bit line. It does not require any particular orientation or linear relationship, but instead refers to the logical relationship between memory cell and data line.

To meet the demand for higher capacity memories, designers continue to strive for increasing memory density (e.g., the number of memory cells in a given area of an integrated circuit die). One way to increase the memory density is to form stacked memory arrays, e.g., often referred to as three-dimensional memory arrays. Operation of such memories having stacked memory arrays can present challenges not encountered in memory arrays formed at a single level.

DETAILED DESCRIPTION

Figure 1:
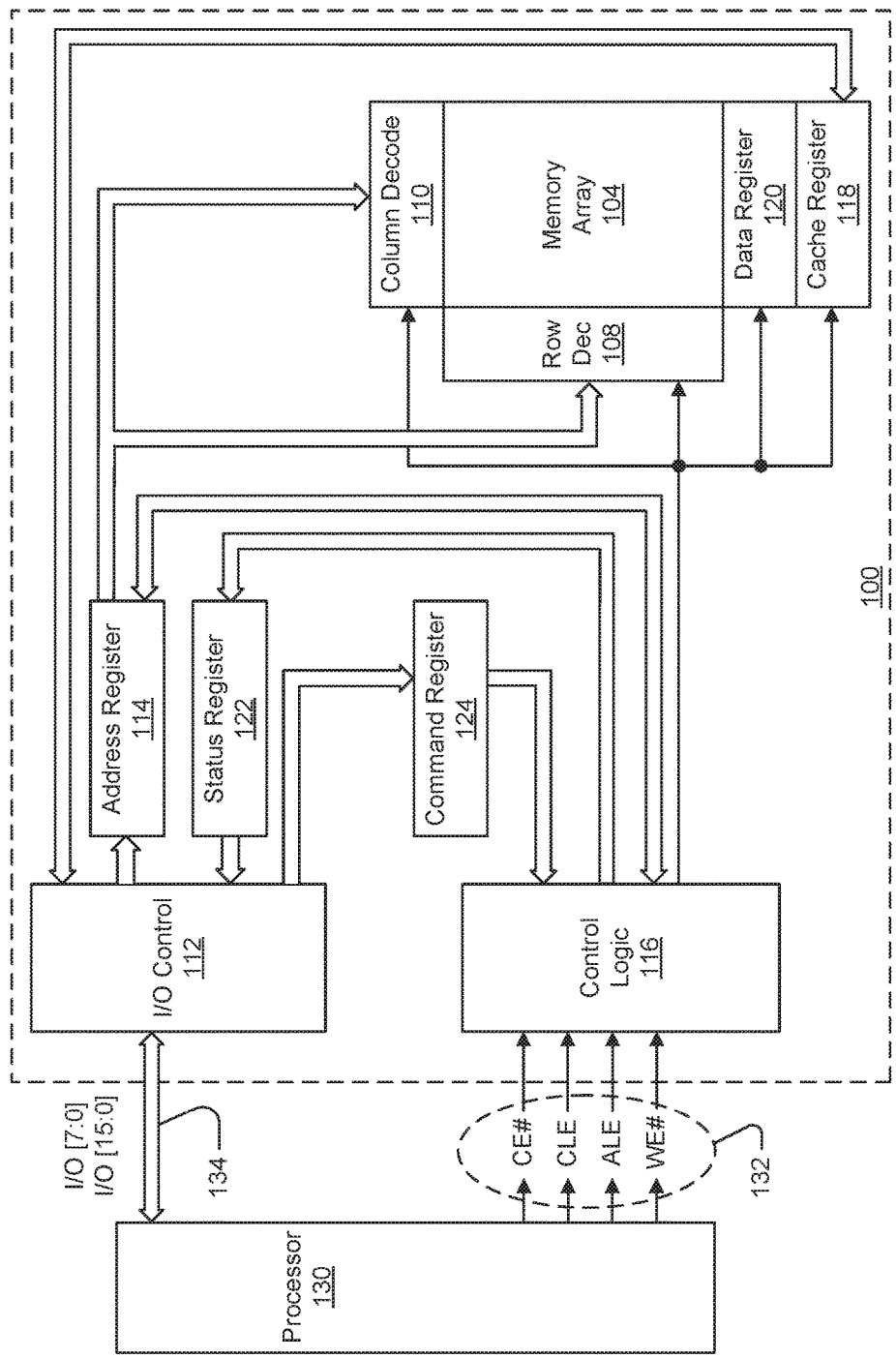
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones, removable memory modules and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are arranged in strings of series-connected memory cells.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller, such as an internal controller (e.g., control logic 116), controls access to the array of memory cells 104 in response to the commands and generates status information for the external processor 130, i.e., control logic 116 is configured to perform access operations (e.g., erase operations) in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118 and data register 120. Cache register 118 latches data, either incoming or outgoing, as directed by control logic 116 to temporarily store data while the array of memory cells 104 is busy writing or reading, respectively, other data. During a programming operation (e.g., often referred to as a write operation), data is passed from the cache register 118 to the data register 120 for transfer to the array of memory cells 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE#, a command latch enable CLE, an address latch enable ALE, and a write enable WE#. Additional control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2A:
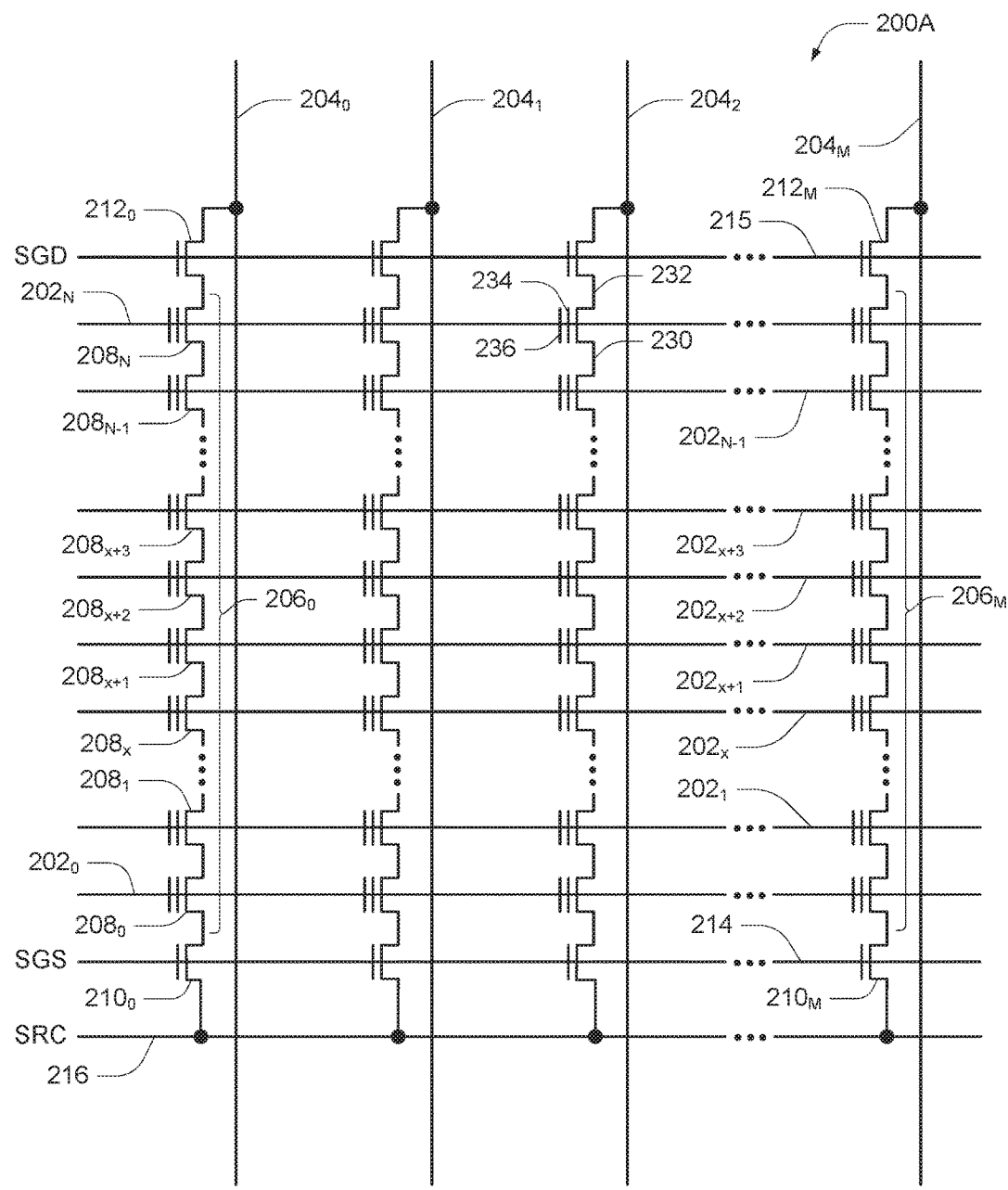
FIG. 2A is a schematic of a portion of an array of memory cells as could be used in a memory of the type described with reference to FIG. 1.

FIG. 2A is a schematic of a portion of an array of memory cells 200A as could be used in a memory of the type described with reference to FIG. 1, e.g., as a portion of array of memory cells 104. Memory array 200A includes access lines, such as word lines $202_0$ to $202_N$, and data lines, such as bit lines $204_0$ to $204_M$. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells, such as one of NAND strings $206_0$ to $206_M$. Each NAND string 206 might be connected (e.g., selectively connected) to a common source 216 and might include memory cells $208_0$ to $208_N$. The memory cells 208 represent non-volatile memory cells for storage of data. The memory cells 208 of each NAND string 206 might be connected in series between a select transistor 210 (e.g., a field-effect transistor), such as one of the select transistors $210_0$ to $210_M$ (e.g., that may be source select transistors, commonly referred to as select gate source), and a select transistor 212 (e.g., a field-effect transistor), such as one of the select transistors $212_0$ to $212_M$ (e.g., that may be drain select transistors, commonly referred to as select gate drain). Select transistors $210_0$ to $210_M$ might be commonly connected to a select line 214, such as a source select line, and select transistors $212_0$ to $212_M$ might be commonly connected to a select line 215, such as a drain select line.

A source of each select transistor 210 might be connected to common source 216. The drain of each select transistor 210 might be connected to a memory cell $208_0$ of the corresponding NAND string 206. For example, the drain of select transistor $210_0$ might be connected to memory cell $208_0$ of the corresponding NAND string $206_0$. Therefore, each select transistor 210 might be configured to selectively connect a corresponding NAND string 206 to common source 216. A control gate of each select transistor 210 might be connected to select line 214.

The drain of each select transistor 212 might be connected to the bit line 204 for the corresponding NAND string 206. For example, the drain of select transistor $212_0$ might be connected to the bit line $204_0$ for the corresponding NAND string $206_0$. The source of each select transistor 212 might be connected to a memory cell $208_N$ of the corresponding NAND string 206. For example, the source of select transistor $212_0$ might be connected to memory cell $208_N$ of the corresponding NAND string $206_0$. Therefore, each select transistor 212 might be configured to selectively connect a corresponding NAND string 206 to a corresponding bit line 204. A control gate of each select transistor 212 might be connected to select line 215.

The memory array in FIG. 2A might be a three-dimensional memory array, e.g., where NAND strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 2A. In some cases, memory cells 208 may further have a defined source 230 and a defined drain 232. Memory cells 208 have their control gates 236 connected to (and in some cases form) a word line 202.

A column of the memory cells 208 is a NAND string 206 or a plurality of NAND strings 206 selectively connected to a given bit line 204. A row of the memory cells 208 may be memory cells 208 commonly connected to a given word line 202. A row of memory cells 208 can, but need not include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not expressly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page. The portion of a physical page (which, in some embodiments, could still be the entire row) that is read during a single read operation or programmed during a programming operation (e.g., an upper or lower page memory cells) might be deemed a logical page. A block of memory cells may include those memory cells that are configured to be erased together, such as all memory cells connected to word lines $202_0$-$202_N$ (e.g., all NAND strings 206 sharing common word lines 202).

Figure 2B:
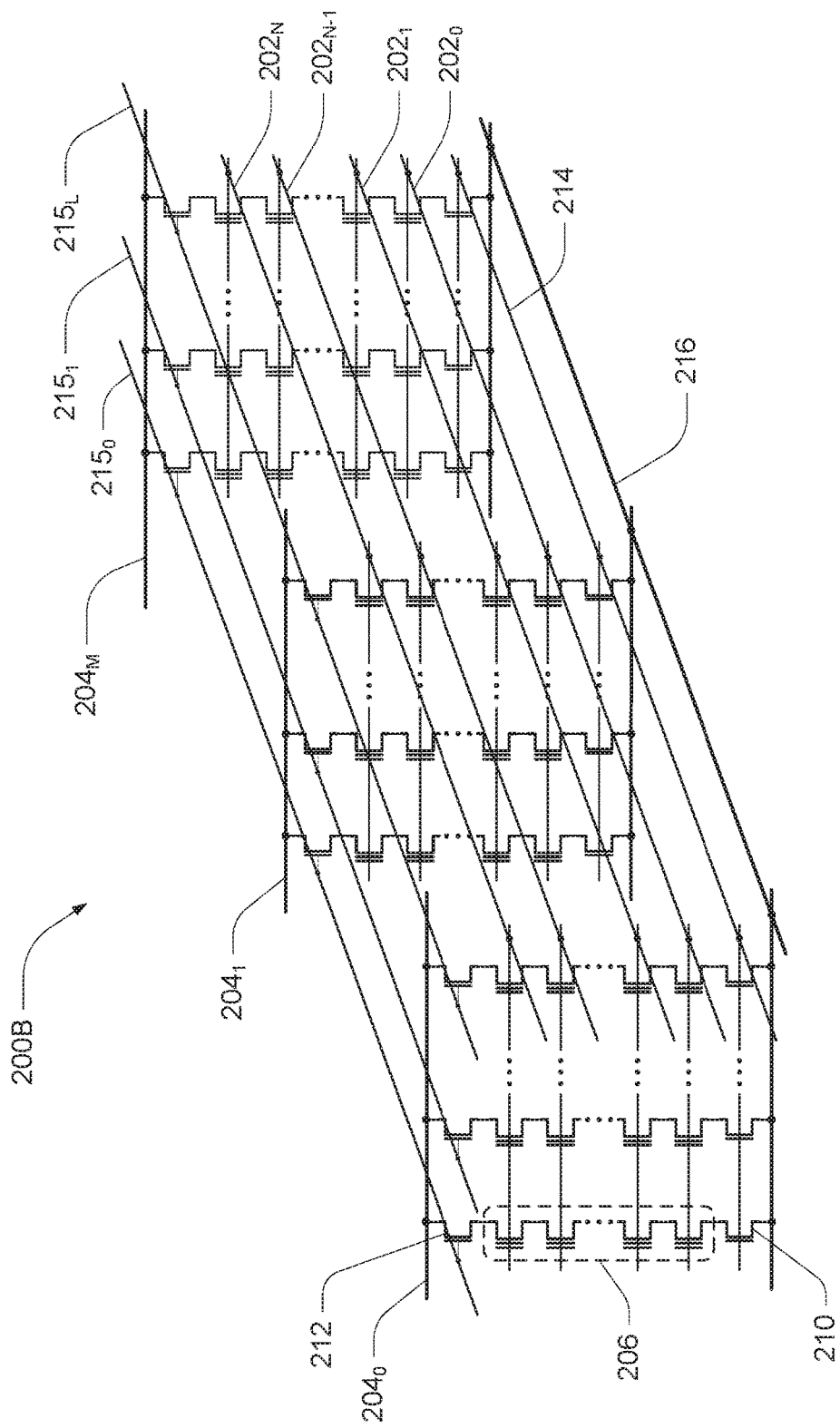
FIG. 2B is another schematic of a portion of an array of memory cells as could be used in a memory of the type described with reference to FIG. 1.

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_L$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Figure 2C:
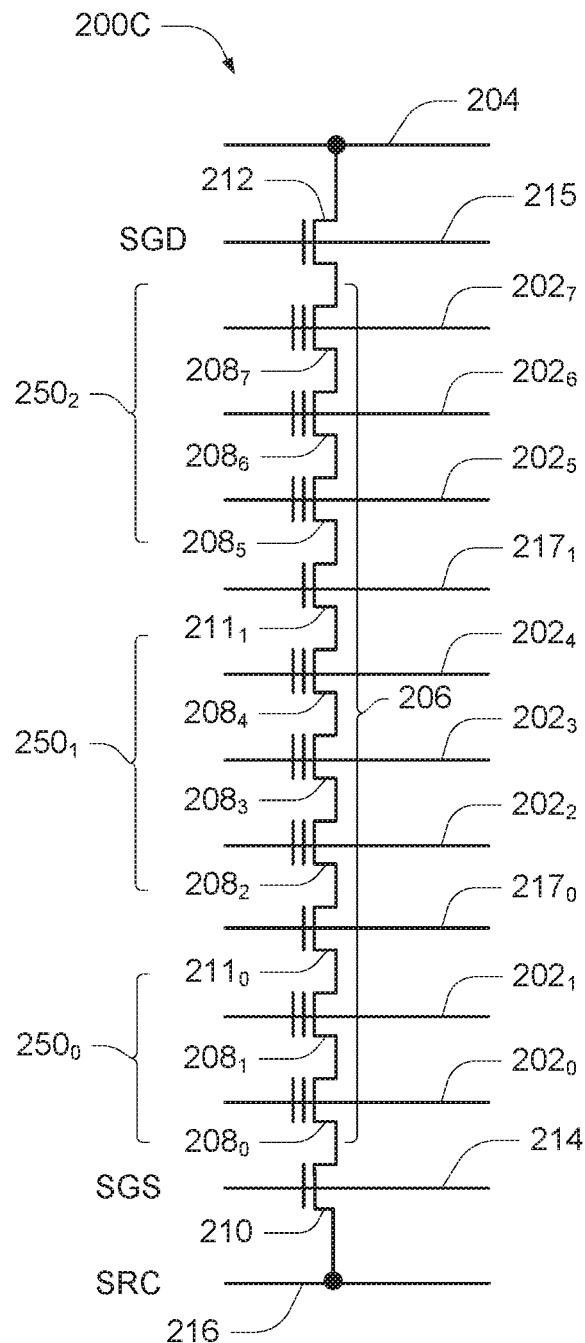
FIG. 2C is another schematic of a portion of an array of memory cells as could be used in a memory of the type described with reference to FIG. 1.

FIG. 2C is another schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. FIG. 2C depicts a single instance of a NAND string 206 with the further inclusion of intermediate select gates 211 that separate decks of memory cells 250 of the NAND string 206. Decks of memory cells 250 will be described in more detail with respect to FIGS. 3A-3C. While the intermediate select gates 211 of FIG. 2C are depicted as simple field-effect transistors, they may alternatively use the same structure as the memory cells 208. When using the structure of a memory cell 208, the intermediate select gates 211 might be maintained in an erased data state, for example, such that these intermediate select gates 211 can utilize the same range of voltage levels as those applied to control gates of memory cells 208. The intermediate gates 211 are connected to respective select lines 217.

Figure 3A:
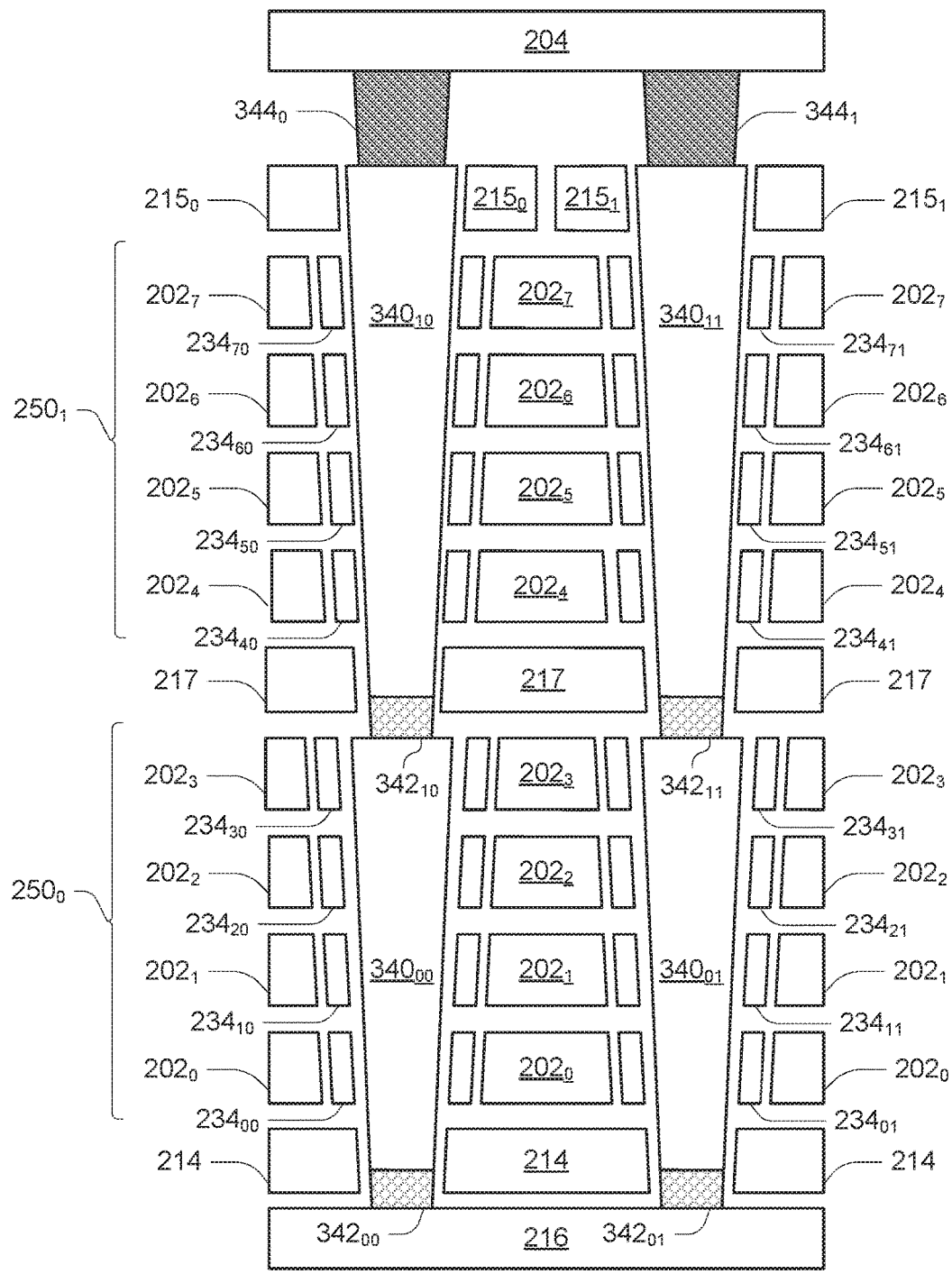
FIG. 3A is a cross-sectional view of a portion of an array of memory cells as background art.

FIG. 3A is a cross-sectional view of a portion of an array of memory cells as background art. Three-dimensional memory arrays are typically fabricated by forming alternating layers of conductors and dielectrics, forming holes in these layers, forming additional materials on sidewalls of the holes to define gate stacks for memory cells and other gates, and subsequently filling the holes with a semiconductor material to define a pillar section to act as channels of the memory cells and gates. To improve conductivity of pillar sections and an adjacent semiconductor material, e.g., upon which they are formed, a conductive (e.g., conductively-doped) portion is typically formed in the pillar section at an interface with the adjacent semiconductor material. These conductive portions are typically formed of a different conductivity type than the pillar section and adjacent semiconductor material. For example, if the pillar section is formed of a P-type semiconductor material, the conductive portion might have an N-type conductivity.

Forming holes through multiple layers typically produces holes of decreasing diameter toward the bottom of the holes due to the nature of the removal processes commonly used in the semiconductor industry. To mitigate against the holes becoming too narrow, formation of arrays of the type described with reference to FIGS. 2A-2C, might be segmented, such that the layers for forming a first portion of the NAND string may be formed, then portions may be removed to define holes, and the remaining structures may be formed within the holes. Following formation of the first portion of the NAND string, a second portion of the NAND string might be formed over the first portion in a similar manner. FIG. 3A depicts a structure of this type.

In FIG. 3A, two strings of series-connected memory cells are depicted in the cross-sectional view. It is noted that the spaces between various elements of the figure may represent dielectric material.

With reference to FIG. 3A, a first NAND string includes a first pillar section $340_{00}$ and a second pillar section $340_{10}$. The first pillar section $340_{00}$ and the second pillar section $340_{10}$ may each be formed of a semiconductor material of a first conductivity type, such as a P-type polysilicon. Conductive portions $342_{00}$ and $342_{10}$ may be formed at the bottoms of the pillar sections $340_{00}$ and $340_{10}$, respectively, with the conductive portion $342_{00}$ electrically connected to the source 216 and the conductive portion $342_{10}$ electrically connected to the pillar section $340_{00}$. The conductive portions $342_{00}$ and $342_{10}$ may be formed of a semiconductor material of a second conductivity type different than the first conductivity type. For the example where the first pillar section $340_{00}$ and the second pillar section $340_{10}$ may each be formed of a P-type polysilicon, the conductive portions $342_{00}$ and $342_{10}$ might be formed of an N-type semiconductor material, such as an N-type polysilicon. In addition, the conductive portions $342_{00}$ and $342_{10}$ might have a higher conductivity level than the pillar sections $340_{00}$ and $340_{10}$. For example, the conductive portions $342_{00}$ and $342_{10}$ might have an N+ conductivity. Alternatively, the conductive portions $342_{00}$ and $342_{10}$ may be formed of a conductor, e.g., a metal or metal silicide.

The pillar section $340_{10}$ is electrically connected to the data line 204 through a conductive plug $344_0$. The conductive plug $344_0$, in this example, might also be formed of a semiconductor material of the second conductivity type, and may likewise have a higher conductivity level than the pillar sections $340_{00}$ and $340_{10}$. Alternatively, the conductive plug $344_0$ may be formed of a conductor, e.g., a metal or metal silicide. The first NAND string further includes a source select gate at an intersection of the source select line 214 and the pillar section $340_{00}$, and a drain select gate at an intersection of the drain select line 215 and the pillar section $340_{10}$. The first NAND string further includes a memory cell at an intersection of each of the access lines $202_0$-$202_7$ and the pillar sections $340_{00}$ and $340_{10}$. These memory cells further include data-storage structures $234_{00}$-$234_{70}$. While the structure of FIG. 3A is depicted to include only eight access lines 202 in an effort to improve readability of the figure, a typical NAND structure might have significantly more access lines 202.

Although not all numbered, for clarity of FIG. 3A, data-storage structures 234 are depicted on both sides of the pillar sections 340. Individual data-storage structures 234 may wrap completely around their respective pillar section 340, thus defining a data-storage structure 234 for a single memory cell. Alternatively, structures are known having segmented data-storage structures 234, such that more than one (e.g., two) memory cells are defined at each intersection of an access line 202 and a pillar section 340. Embodiments described herein are independent of the number of memory cells defined around a pillar section 340.

To improve the conductivity across the conductive portion $342_{10}$, the first NAND string further includes an intermediate gate at an intersection of the select line 217. This divides the memory cells of the first NAND string into a first deck of memory cells $250_0$ and a second deck of memory cells $250_1$.

The decks of memory cells 250 can generally be thought of as groupings of memory cells sharing a common pillar section 340, i.e., a single pillar section 340 acting as channel regions for that grouping of memory cells, and can be extended to include a plurality of groupings of memory cells, where each such grouping of memory cells shares a common pillar section 340, and the respective common pillar sections 340 are formed at the same level (e.g., are intersected by the same access lines 202), which may include all such groupings of memory cells sharing a common set (e.g., one or more) of access lines 202. For example, deck of memory cells $250_0$ may include those memory cells formed at the intersections of access lines $202_0$ and $202_1$ with the pillar section $340_{00}$. The deck of memory cells $250_0$ may further include those memory cells formed at the intersections of access lines $202_0$ and $202_1$ with their respective pillar sections $340_{00}$ and $340_{01}$, and may still further include all memory cells formed at the intersections of access lines $202_0$ and $202_1$ with the pillar sections $340_{00}$ and $340_{01}$, and any other pillar sections 340 formed at the same level.

With further reference to FIG. 3A, a second NAND string includes the first pillar section $340_{01}$ and a second pillar section $340_{11}$. The first pillar section $340_{01}$ and a second pillar section $340_{11}$ may each be formed of a semiconductor material of the first conductivity type, such as a P-type polysilicon. Conductive portions $342_{01}$ and $342_{11}$ may be formed at the bottoms of the pillar sections $340_{01}$ and $340_{11}$, respectively, with the conductive portion $342_{01}$ electrically connected to the source 216 and the conductive portion $342_{11}$ electrically connected to the pillar section $340_{01}$. The conductive portions $342_{01}$ and $342_{11}$ may be formed of a semiconductor material of the second conductivity type. For the example where the first pillar section $340_{01}$ and a second pillar section $340_{11}$ may each be formed of a P-type polysilicon, the conductive portions $342_{01}$ and $342_{11}$ might be formed of an N-type semiconductor material, such as an N-type polysilicon. In addition, the conductive portions $342_{01}$ and $342_{11}$ might have a higher conductivity level than the pillar sections $340_{01}$ and $340_{11}$. For example, the conductive portions $342_{01}$ and $342_{11}$ might have an N+ conductivity.

The pillar section $340_{11}$ is electrically connected to the data line 204 through a conductive plug $344_1$. The conductive plug $344_1$, in this example, might also be formed of a semiconductor material of the second conductivity type, and may likewise have a higher conductivity level than the pillar sections $340_{01}$ and $340_{11}$. Alternatively, the conductive plug $344_1$ may be formed of a conductor, e.g., a metal or metal silicide. The second NAND string further includes a source select gate at an intersection of the source select line 214 and the pillar section $340_{01}$, and a drain select gate at an intersection of the drain select line 215 and the pillar section $340_{11}$. The second NAND string further includes a memory cell at an intersection of each of the access lines $202_0$-$202_7$ and the pillar sections $340_{01}$ and $340_{11}$. These memory cells further include data-storage structures $234_{01}$-$234_{71}$.

To improve the conductivity across the conductive portion $342_{11}$, the second NAND string further includes an intermediate gate at an intersection of the select line 217 and the pillar section $340_{11}$. This divides the memory cells of the second NAND string into the first deck of memory cells $250_0$ and the second deck of memory cells $250_1$.

As technology changes, there may be a desire to form pillar sections 340 having smaller lateral dimensions, or there may be a desire to form NAND strings with increasing numbers of memory cells. Both situations may lead to forming the NAND strings using more than two decks of memory cells 250. This change in the number of decks of memory cells 250 in a NAND string may bring operational challenges.

Figure 3B:
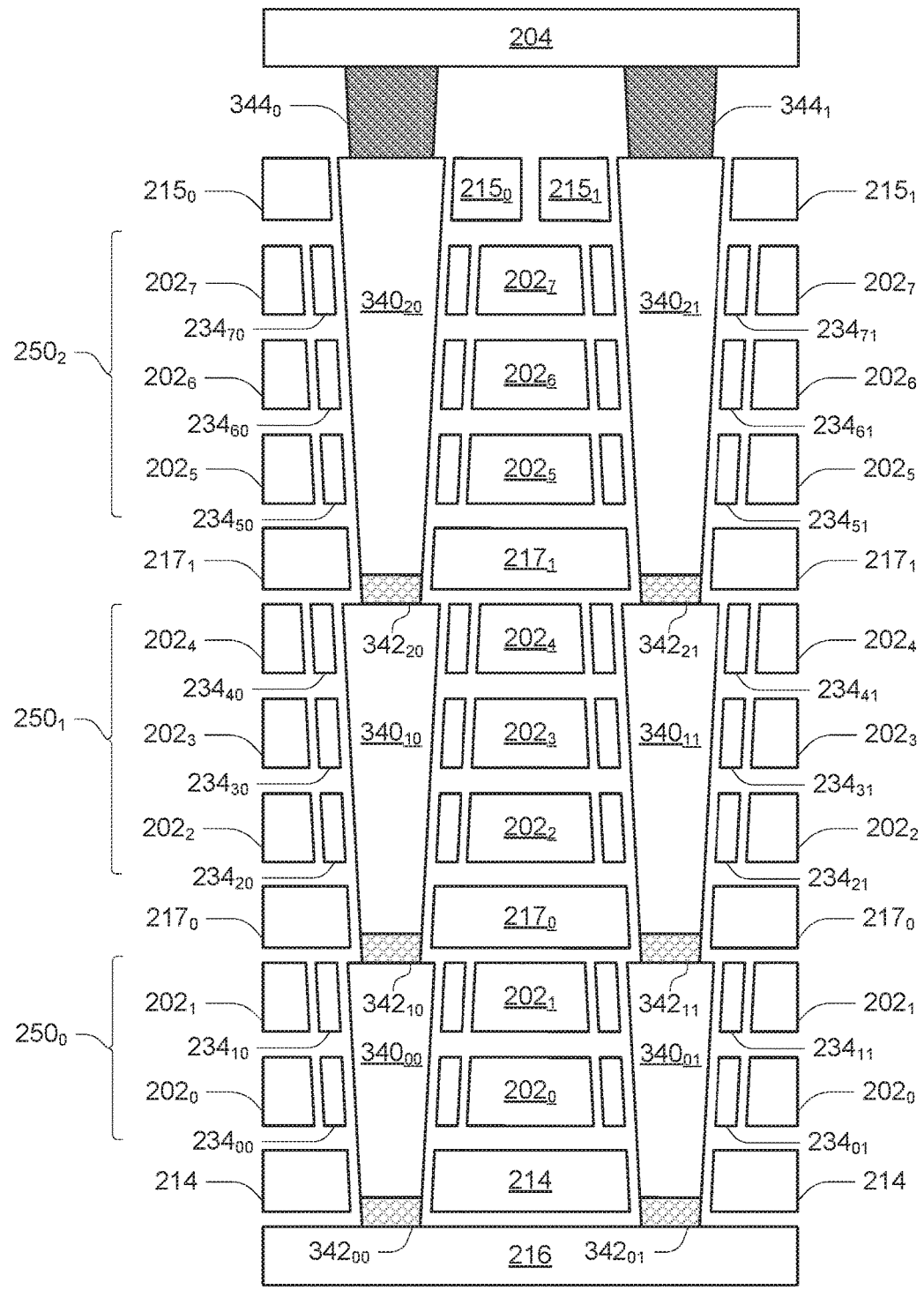
FIG. 3B is a cross-sectional view of a portion of an array of memory cells for use with embodiments.

FIG. 3B is a cross-sectional view of a portion of an array of memory cells for use with embodiments. The structure of FIG. 3B differs from that of FIG. 3A by the inclusion of additional pillar sections 340 (i.e., $340_{20}$ and $340_{21}$) between the source 216 and the data line 204, and the corresponding additional conductive portions 342 (i.e., $342_{20}$ and $342_{21}$) and an additional select line 217 (i.e., $217_1$). Although the structure of FIG. 3B is depicted to include only eight access lines 202 in an effort to improve readability of the figure, various embodiments may be performed on NAND structures having fewer or more access lines 202. Similarly, while the resulting decks of memory cells 250 of FIG. 3B are depicted to have fewer corresponding memory cells than those of FIG. 3A, and the decks of memory cells 250 of FIG. 3B are depicted to have differing numbers of memory cells, embodiments described herein are independent of the number of memory cells associated with an individual deck of memory cells 250 or any combination of decks of memory cells 250.

Figure 3C:
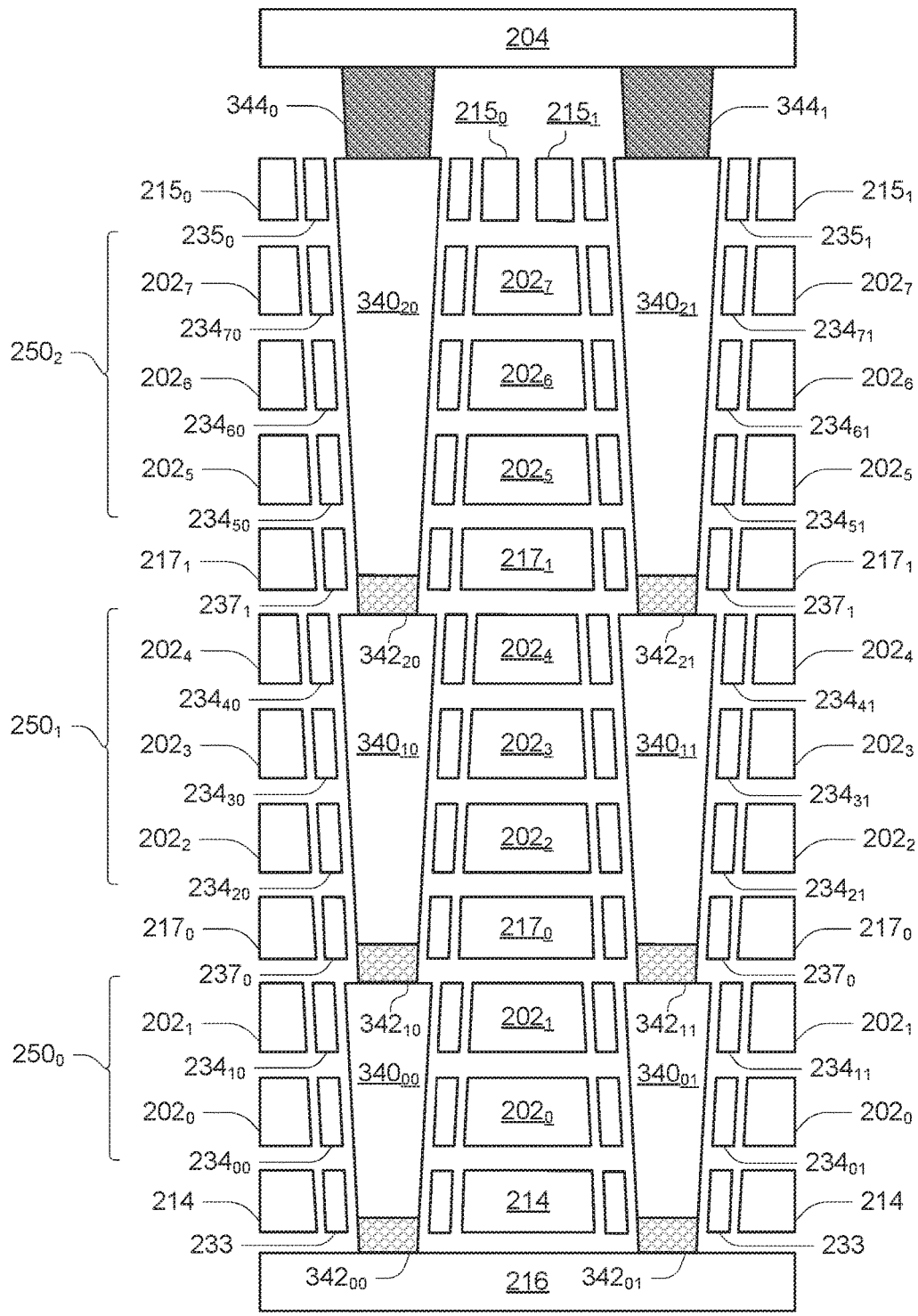
FIG. 3C is another cross-sectional view of a portion of an array of memory cells for use with embodiments.

While the select lines 214, 215 and 217 are depicted in FIG. 3B for form select gates as simple field-effect transistors (e.g., as select gates 210, 212 and 211, respectively, as shown in FIG. 2C), it is possible to use the same structure as the memory cells. FIG. 3C is another cross-sectional view of a portion of an array of memory cells for use with embodiments. The structure of FIG. 3C differs from that of FIG. 3B by the inclusion of charge-storage structures 233, 235 and 237 between their respective select lines 214, 215 and 217. The resulting select gates might be operated as dummy memory cells, e.g., not addressable for storage of user data. Dummy memory cells may be each programmed to some common data state, e.g., an erased data state, and receive the same voltages as the memory cells of their corresponding decks of memory cells, i.e., those memory cells sharing a same pillar section 340 as the corresponding select gate. Alternatively, these dummy memory cells may be operated as if they were simple field-effect transistors without regard to any data state.

Figure 3D:
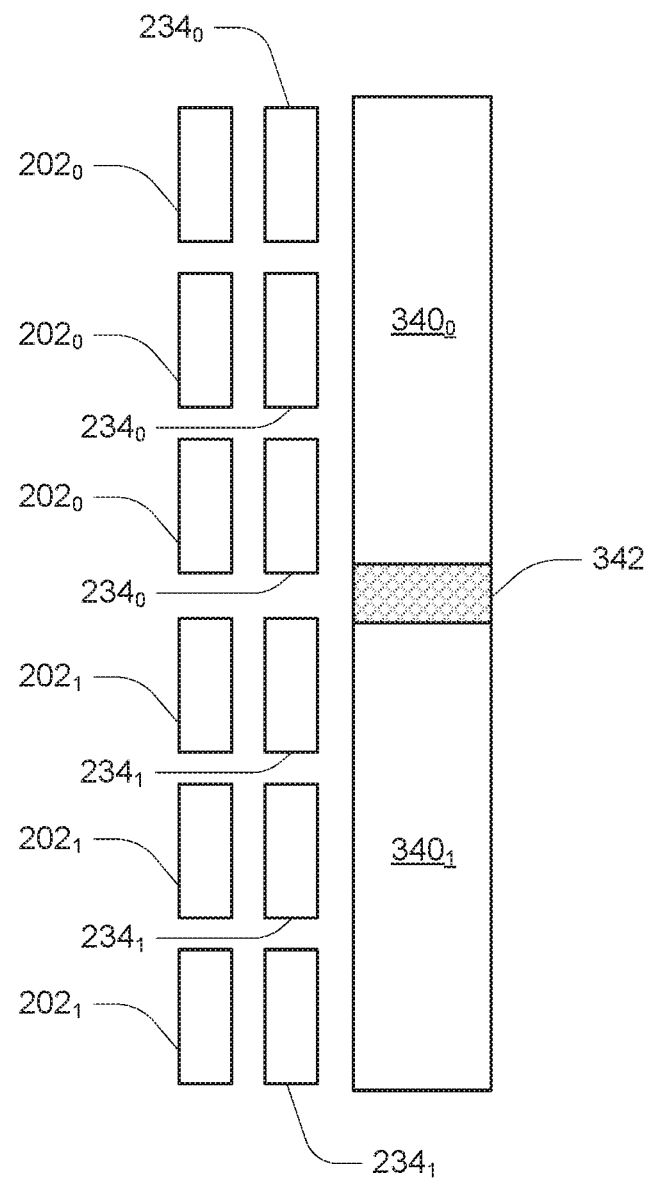
FIG. 3D is a simplified cross-sectional view of a portion of an array of memory cells for use with embodiments.

FIG. 3D is a simplified cross-sectional view of a portion of a string of series-connected memory cells for use with embodiments. The string of series-connected memory cells includes a first semiconductor material $340_0$ having a first conductivity type and a second semiconductor material $340_1$ having the first conductivity type. The string of series-connected memory cells further includes a third semiconductor material 342 having a second conductivity type different than (e.g., opposite of) the first conductivity type between the first semiconductor material $340_0$ and the second semiconductor material $340_1$. A first grouping of memory cells of the string of series-connected memory cells, represented by access lines $202_0$ and data-storage structures $234_0$, is adjacent the first semiconductor material $340_0$. The first semiconductor material $340_0$ may form channel regions for the first grouping of memory cells. A second grouping of memory cells of the string of series-connected memory cells, represented by access lines $202_1$ and data-storage structures $234_1$, is adjacent the second semiconductor material $340_1$. The second semiconductor material $340_1$ may form channel regions for the second grouping of memory cells. For various embodiments, when a voltage level developed on the first semiconductor material $340_0$ is different than (e.g., less than) a voltage level developed on second semiconductor material $340_1$, e.g., during an erase operation on the first and second groupings of memory cells, voltage levels applied to the access lines $202_0$ are different than (e.g., less than) voltage levels applied to the access lines $202_1$. A voltage level of either the first semiconductor material $340_0$ or the second semiconductor material $340_1$ may be developed in response to a higher voltage level of the second semiconductor material $340_1$ or the first semiconductor material $340_0$, respectively, through a voltage drop across the third semiconductor material 342. For example, a voltage level might be applied to one of the semiconductor materials 340, either directly or through some other semiconductor material having the second conductivity type, thus developing its voltage level, and a resulting voltage level may be developed in the other semiconductor material 340 through the semiconductor material 342.

Figure 4A:
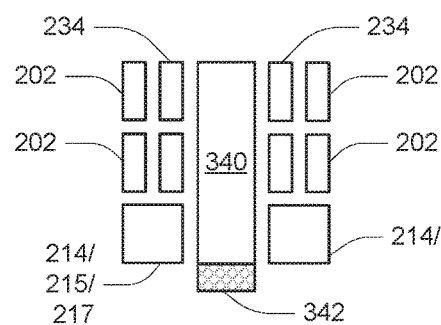
FIGS. 4A-4D are simplified cross-sectional views of portions of NAND strings for use with embodiments.
Figure 4B:
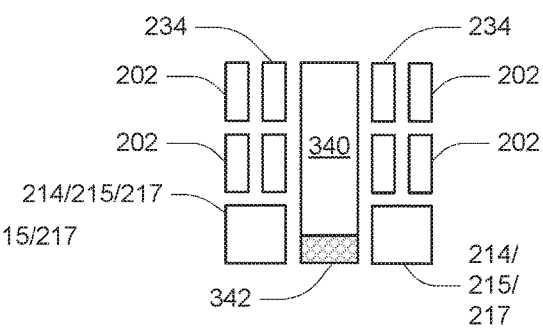
Figure 4C:
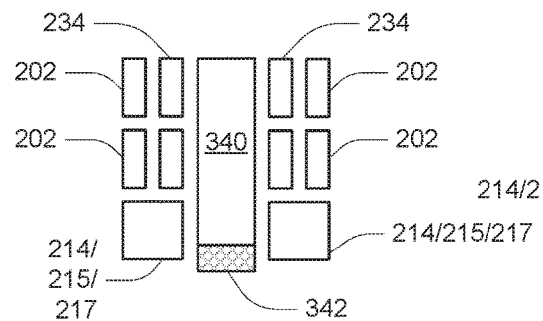
Figure 4D:
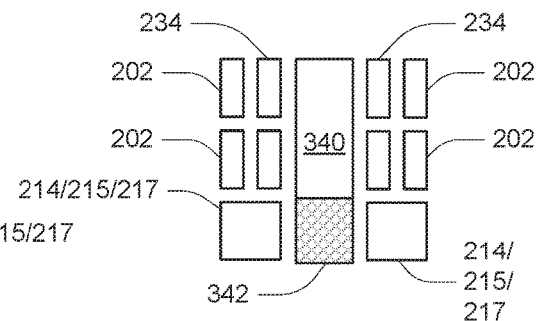

FIGS. 4A-4D are simplified cross-sections views of portions of NAND strings for use with embodiments and depicting relationships between the conductive portions 342 and corresponding select lines, e.g., 214, 215 or 217. Note that while the select lines of FIG. 4A-4D are shown to form simple field-effect transistors, the resulting select gates could also use the same structure as the memory cells, as described with reference to FIG. 3C. FIG. 4A shows the conductive portion 342 residing completely outside the length of the channel region of the select gate at the intersection of select line 214/215/217 and the pillar section 340. FIG. 4B shows the conductive portion 342 residing completely within the length of the channel region of the select gate at the intersection of select line 214/215/217 and the pillar section 340. FIG. 4C shows the conductive portion 342 residing partially within the length of the channel region of the select gate at the intersection of select line 214/215/217 and the pillar section 340. And FIG. 4D shows the conductive portion 342 extending beyond the length of the channel region of the select gate at the intersection of select line 214/215/217 and the pillar section 340. It is further noted that each of the FIGS. 4A-4D could be inverted with the conductive portions 342 at the top of the pillar sections 340 as the conductive portions 342 may be formed at the tops of the pillar sections 340 rather than at the bottom as described with reference to FIGS. 3A-3C.

Although the conductive portions 342 and/or conductive plugs 344 are provided to improve conductivity, e.g., between adjacent pillar sections 340, between a pillar section 340 and a source 216 or between a pillar section 340 and a data line 204, where these conductive elements are formed of a semiconductor material having a conductivity type different than a conductivity type of the pillar sections 340 or source 216, a diode is effectively formed such that a voltage drop might be expected across each one. Such a voltage drop is generally not of concern in operating a structure such as depicted in FIG. 3A where only two pillar sections 340 are used. However, as three or more pillar sections 340 are used, such as depicted in FIGS. 3B-3C, these voltage drops can create operational differences. For example, if an erase voltage is applied to the data line 204 and the source 216 of FIG. 3B, the memory cells of decks of memory cells $250_0$ and $250_2$ may be expected to experience a different (e.g., higher) channel voltage level than the memory cells of the deck of memory cells $250_1$. Because of the difference in channel voltage levels among the decks of memory cells 250, the resulting range of threshold voltages for memory cells of decks of memory cells $250_0$ and $250_2$ may be expected to be different than (e.g., lower than) the resulting range of threshold voltages for memory cells of the deck of memory cells $250_1$.

Consider the example of performing an erase operation on memory cells of the structure of FIG. 3A versus a similar erase operation on memory cells of the structure of FIG. 3B. Table 1 provides voltages as might be applied to the structure of FIG. 3A while Table 2 provides voltages as might be applied to the structure of FIG. 3B. The examples of Tables 1 and 2 depict a portion of an erase operation. Typically, an erase operation includes a series of erase pulses (e.g., Pulse 1, Pulse 2, Pulse 3, . . . ) applied to the NAND strings through their respective data lines 204 and source 216 while voltages (identified as the voltages for the decks 250 in the tables) are applied to the access lines 202 sufficient to activate the corresponding memory cells. While 1V is depicted in the examples, other voltage levels sufficient to activate the corresponding memory cells may be used. An erase verify operation may be performed between pulses to determine if the memory cells have been sufficiently erased (e.g., have threshold voltages at or below some target value). If the erase verify is failed, another erase pulse, typically having a higher voltage level, may be applied. Erase operations typically rely on GIDL (gate-induced drain leakage) to provide current to the pillar sections 340. Due to differing characteristics at opposing ends of the NAND string, the voltage applied to the drain select line 215 may be different than the voltage applied to the source select line 214.

TABLE 1

|  | Pulse 1 | Pulse 2 | Pulse 3 |
| --- | --- | --- | --- |
| Data Line 204 | 15 V | 17 V | 19 V |
| Select Line 215 | 11 V | 13 V | 15 V |
| Deck $250_1$ | 1 V | 1 V | 1 V |
| Deck $250_0$ | 1 V | 1 V | 1 V |
| Select Line 214 | 10 V | 12 V | 14 V |
| Source 216 | 15 V | 17 V | 19 V |

TABLE 2

|  | Pulse 1 | Pulse 2 | Pulse 3 |
| --- | --- | --- | --- |
| Data Line 204 | 15 V | 17 V | 19 V |
| Select Line 215 | 11 V | 13 V | 15 V |
| Deck $250_2$ | 1 V | 1 V | 1 V |
| Deck $250_1$ | 1 V | 1 V | 1 V |
| Deck $250_0$ | 1 V | 1 V | 1 V |
| Select Line 214 | 10 V | 12 V | 14 V |
| Source 216 | 15 V | 17 V | 19 V |

In the example of Tables 1 and 2, the resulting range of threshold voltages for memory cells of decks of memory cells $250_0$ and $250_1$ of FIG. 3A, as well as of decks of memory cells $250_0$ and $250_2$ of FIG. 3B, might fall in the range of −3V to −1V, while the resulting range of threshold voltages for memory cells of the deck of memory cells $250_1$ of FIG. 3B might fall in the range of −2V to 0V. For this example, not only would the resulting overall range of threshold voltages for a full NAND string of memory cells of FIG. 3B be wider than for a full NAND string of memory cells of FIG. 3A, the memory cells of the different decks of memory cells 250 of FIG. 3B might be expected to program differently as well. Various embodiments use erase de-biasing of the voltages applied to the access lines 202, and thus to the control gates of the corresponding memory cells, during an erase operation of a string of series-connected memory cells to mitigate the differences in their channel voltage levels (e.g., the voltage level differences of the pillar sections 340).

Table 3 illustrates an example where erase de-biasing is implemented in reference to an erase operation performed on the structure of FIG. 3B. Where data line 204 and source 216 voltages are applied in the same manner as in Table 2, the memory cells of the deck $250_1$ might be expected to experience a lower channel voltage level than the memory cells of the decks of memory cells $250_0$ and $250_2$ due to the expected voltage drops across the conductive portions $342_{10}/342_{11}$ and $342_{20}/342_{21}$, respectively, where those conductive portions $342_{10}/342_{11}$ and $342_{20}/342_{21}$ have one conductivity type and the pillar sections $340_{00}$-$340_{20}$ and $340_{01}$-$340_{21}$ have a different conductivity type. For purposes of discussion, the voltage drop across each resulting diode will be considered to be 1V. The actual voltage drop for diodes along a given string of series-connected memory cells may depend upon materials of construction and configuration, but may be determined experimentally, empirically or through simulation.

To mitigate this difference in channel (e.g., body) voltages in different pillar sections 340, voltages applied to access lines 202 for the memory cells of the deck $250_1$ might be reduced relative to voltages applied to access lines 202 for the memory cells of the decks of memory cells $250_0$ and $250_2$. For some embodiments, the voltages applied across the string of series-connected memory cells (e.g., from the data line 204 and source 216) might be increased over a typical erase operation such that the deck of memory cells 250 experiencing the largest voltage drop might experience the same channel voltage level as in the typical erase operation. In the example of Table 3, the voltages applied to the data line 204 and source 216, as well as the voltages applied to the corresponding select lines 215 and 214, respectively, for each erase pulse are 1V higher than the voltages applied in the example of Table 1 such that the memory cells of deck of memory cells $250_1$ of Table 3 might experience the same conditions (e.g., voltage difference from gate to channel) as those of the example of Table 1. Accordingly, the voltages applied to the access lines 202 of decks of memory cells $250_0$ and $250_2$ might be 1V higher such they might also result in a similar (e.g., the same) gate-to-channel voltage.

TABLE 3

|  | Pulse 1 | Pulse 2 | Pulse 3 |
| --- | --- | --- | --- |
| Data Line 204 | 16 V | 18 V | 20 V |
| Select Line 215 | 12 V | 14 V | 16 V |
| Deck $250_2$ | 2 V | 2 V | 2 V |
| Deck $250_1$ | 1 V | 1 V | 1 V |
| Deck $250_0$ | 2 V | 2 V | 2 V |
| Select Line 214 | 11 V | 13 V | 15 V |
| Source 216 | 16 V | 18 V | 20 V |

Tables 4 and 5 provide additional examples of performing erase operations on strings of series-connected memory cells similar to those described with reference to FIG. 3B, but with additional decks of memory cells 250. For example, a deck of memory cells 250 having a structure of deck of memory cells $250_1$ could be repeated one or more times with appropriate renumbering of the decks of memory cells 250. In the example of Table 4, consider the structure of FIG. 3B with an additional deck of memory cells 250 resulting in decks of memory cells $250_0$-$250_3$ (e.g., the structure of FIG. 5, discussed infra, but without decks of memory cells $250_4$-$250_7$, and without diode drops $543_5$-$543_7$). In this example, the decks of memory cells $250_0$ and $250_3$ might be expected to experience channel voltage levels similar to one another, and the decks of memory cells $250_1$ and $250_2$ might be expected to experience channel voltage levels similar to one another and less than the channel voltage levels of the decks of memory cells $250_0$ and $250_3$. In the example of Table 5, consider the structure of FIG. 3B with two additional decks of memory cells 250 resulting in decks of memory cells $250_0$-$250_4$ (e.g., the structure of FIG. 5, but without decks of memory cells $250_5$-$250_7$, and without diode drops $543_6$-$543_7$). In this example, the decks of memory cells $250_0$ and $250_4$ might be expected to experience channel voltage levels similar to one another, the decks of memory cells $250_1$ and $250_3$ might be expected to experience channel voltage levels similar to one another and less than the channel voltage levels of the decks of memory cells $250_0$ and $250_4$, and the deck of memory cells $250_2$ might be expected to experience a channel voltage level less than the channel voltage levels of the decks of memory cells $250_1$ and $250_3$.

TABLE 4

|  | Pulse 1 | Pulse 2 | Pulse 3 |
| --- | --- | --- | --- |
| Data Line 204 | 16 V | 18 V | 20 V |
| Select Line 215 | 11 V | 13 V | 15 V |
| Deck $250_3$ | 2 V | 2 V | 2 V |
| Deck $250_2$ | 1 V | 1 V | 1 V |
| Deck $250_1$ | 1 V | 1 V | 1 V |
| Deck $250_0$ | 2 V | 2 V | 2 V |
| Select Line 214 | 10 V | 12 V | 14 V |
| Source 216 | 16 V | 18 V | 20 V |

TABLE 5

|  | Pulse 1 | Pulse 2 | Pulse 3 |
| --- | --- | --- | --- |
| Data Line 204 | 17 V | 19 V | 21 V |
| Select Line 215 | 11 V | 13 V | 15 V |
| Deck $250_4$ | 3 V | 3 V | 3 V |
| Deck $250_3$ | 2 V | 2 V | 2 V |
| Deck $250_2$ | 1 V | 1 V | 1 V |
| Deck $250_1$ | 2 V | 2 V | 2 V |
| Deck $250_0$ | 3 V | 3 V | 3 V |
| Select Line 214 | 10 V | 12 V | 14 V |
| Source 216 | 17 V | 19 V | 21 V |

Figure 5:
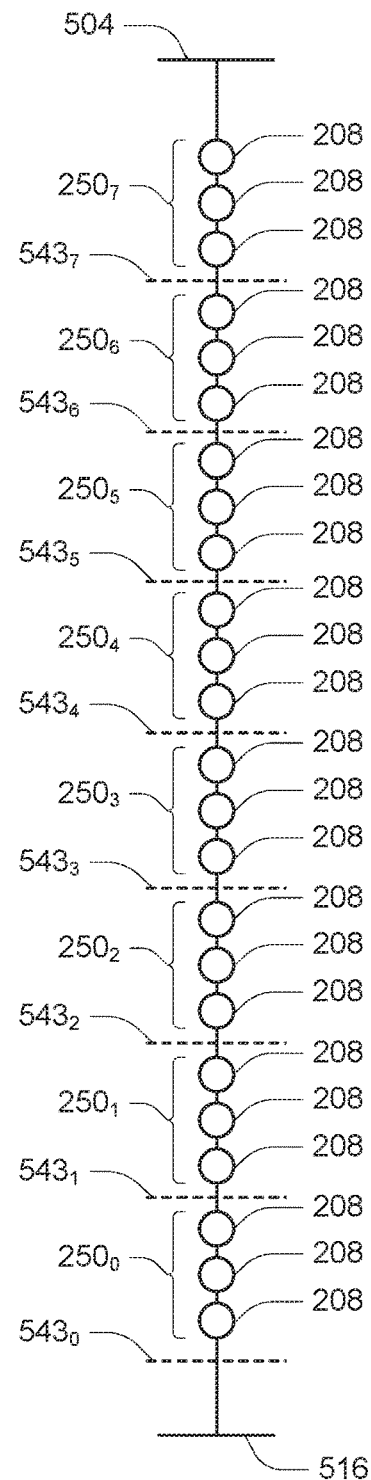
FIG. 5 is a conceptual view of a string of series-connected memory cells for use in describing erase de-biasing in accordance with embodiments.

FIG. 5 is a conceptual view of a string of series-connected memory cells for use in further describing erase de-biasing in accordance with embodiments. FIG. 5 depicts a string of series-connected memory cells 208 arranged in eight decks of memory cells $250_0$-$250_7$. Each deck of memory cells $250_0$-$250_7$ is depicted to have three memory cells 208. However, individual decks of memory cells $250_0$-$250_7$ can include more or less memory cells 208, and one deck of memory cells 250 can include a different number of memory cells 208 than an adjacent deck of memory cells 250.

Dashed lines $543_0$-$543_7$ indicate diode drops between the decks of memory cells 250, e.g., conductive portions having a different conductivity type than adjacent materials in a path between the memory cells 208 of a particular deck of memory cells 250 and memory cells 208 of an adjacent (e.g., immediately adjacent) deck of memory cells 250, or between the memory cells 208 of a particular deck of memory cells 250 and a voltage source, such as voltage node 504 (e.g., which might correspond to a data line 204) and a voltage node 516 (e.g., which might correspond to a source 216). There is no diode drop 543 indicated between memory cells 208 of the deck of memory cells $250_7$. This might occur, for example, where the conductive plug 344 between a data line 204 and a pillar section 340 is formed of a conductor, e.g., metal or metal silicide, without a material of a different conductivity type in contact with that pillar section 340. In a similar manner, diode drop $543_0$ might be eliminated by likewise forming the lower conductive portion 342 of a conductor.

Referring to FIG. 5, if the same voltage levels (e.g., erase voltage $V_E$) are applied to the voltage nodes 504 and 516, the deck of memory cells $250_7$ might be expected to experience the highest channel voltage level (e.g., $V_{C1}$) of the string as there is no diode drop 543 between it and the voltage node 504. $V_{C1}$ might be expected to be substantially equal to (e.g., equal to) the erase voltage $V_E$. Decks of memory cells $250_6$ and $250_0$ might be expected to experience a lower channel voltage level (e.g., $V_{C2}$) as there is one diode drop 543 between them and their respective voltage node 504 or 516. Decks of memory cells $250_5$ and $250_1$ might be expected to experience a next lower channel voltage level (e.g., $V_{C3}$) as there are two diode drops 543 between them and their respective voltage node 504 or 516. Decks of memory cells $250_4$ and $250_2$ might be expected to experience a next lower channel voltage level (e.g., $V_{C4}$) as there are three diode drops 543 between them and their respective voltage node 504 or 516. And deck of memory cells $250_3$ might be expected to experience a next lower channel voltage level (e.g., $V_{C5}$) as there are four diode drops 543 between it and both voltage nodes 504 or 516. In this manner, $V_E \approx V_{C1} > V_{C2} > V_{C3} > V_{C4} > V_{C5}$. The differences between $V_{C1}$ and $V_{C2}$, between $V_{C2}$ and $V_{C3}$, between $V_{C3}$ and $V_{C4}$, and between $V_{C4}$ and $V_{C5}$ may each be substantially equal (e.g., equal), and may be determined from (e.g., equal to) an expected voltage drop between one semiconductor pillar section 340 having a first conductivity type and another semiconductor pillar section 340 having the first conductivity type across a conductive portion 342 between the two pillar sections 340 and having a second conductivity type different than (e.g., opposite of) the first conductivity type. While the lowest of the voltages (e.g., $V_{C5}$ in this example) applied to the access lines 202 might be a reference potential (e.g., 0V, ground or $V_{SS}$), it is often desirable that this voltage level be some positive value (e.g., 1V) above the reference potential sufficient to cut off pass transistors between global access lines and access lines 202 of blocks not selected for the erase operation. Furthermore, when referring to a number of diode drops between memory cells and a voltage node or their applied voltages, it is the minimum number of diode drops to either voltage node. For example, where deck of memory cells $250_4$ has three diode drops 543 between it and a voltage applied to voltage node 504, and has five diode drops 543 between it and a voltage applied to voltage node 516, the number of diode drops between the deck of memory cells $250_4$ and an applied voltage is three.

For various embodiments, the voltage levels applied to the corresponding access lines for each of the decks of memory cells 250 would share this same decreasing relationship. In other words, for a given string of series-connected memory cells 206, the voltage level applied to access lines 202 of a deck of memory cells 250 might be less than the voltage level applied to access lines 202 of a deck of memory cells 250 having a higher channel voltage level (e.g., higher expected channel voltage level), and greater than the voltage level applied to access lines 202 of a deck of memory cells 250 having a lower channel voltage level (e.g., lower expected channel voltage level). The voltage level applied to access lines 202 of a deck of memory cells 250 might further be substantially equal to (e.g., equal to) the voltage level applied to access lines 202 of a deck of memory cells 250 having a substantially equal (e.g., equal) channel voltage level (e.g., expected channel voltage level). In addition, this general relationship may be used even if voltages applied to the voltage nodes 504 and 516 are different.

Consider the example of FIG. 5, but further including an additional diode drop 543 between the deck of memory cells $250_7$ and the voltage node 504. In this configuration, if the same voltage levels are applied to the voltage nodes 504 and 516, the decks of memory cells $250_7$ and $250_0$ might be expected to experience the highest channel voltage level (e.g., $V_{C1}$) as there would be one diode drop 543 between them and their respective voltage node 504 or 516. Decks of memory cells $250_6$ and $250_1$ might be expected to experience a lower channel voltage level (e.g., $V_{C2}$) as there would be two diode drops 543 between them and their respective voltage node 504 or 516. Decks of memory cells $250_5$ and $250_2$ might be expected to experience a next lower channel voltage level (e.g., $V_{C3}$) as there would be three diode drops 543 between them and their respective voltage node 504 or 516. And decks of memory cells $250_4$ and $250_3$ might be expected to experience a next lower channel voltage level (e.g., $V_{C4}$) as there would be four diode drops 543 between them and their respective voltage node 504 or 516. In this manner, $V_E > V_{C1} > V_{C2} > V_{C3} > V_{C4}$. The differences between $V_{C1}$ and $V_{C2}$, between $V_{C2}$ and $V_{C3}$, and between $V_{C3}$ and $V_{C4}$ may each be substantially equal (e.g., equal), and may be determined from (e.g., equal to) an expected voltage drop between one semiconductor pillar section 340 having a first conductivity type and another semiconductor pillar section 340 having the first conductivity type across a conductive portion 342 between the two pillar sections 340 and having a second conductivity type different than (e.g., opposite of) the first conductivity type.

Figure 6:
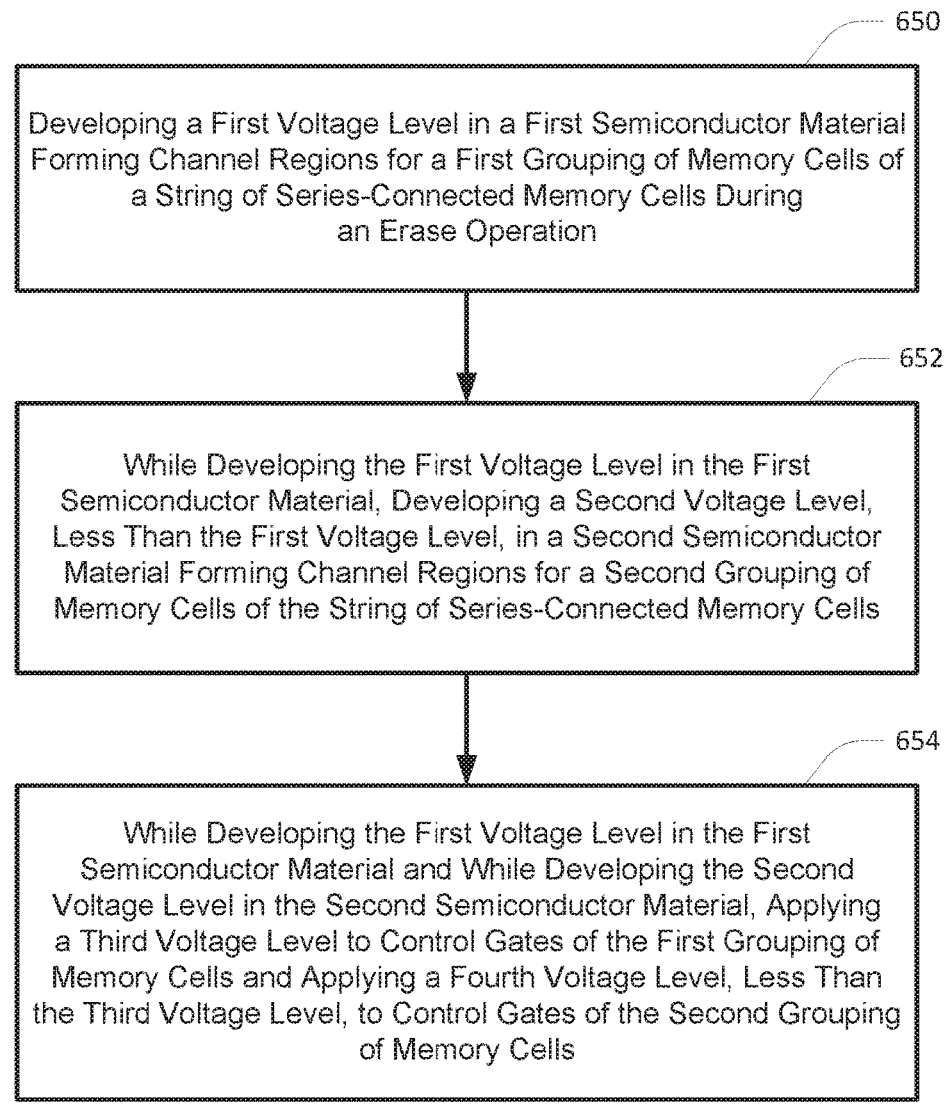
FIG. 6 is a flowchart of a method of operating a memory in accordance with an embodiment.

FIG. 6 is a flowchart of a method of operating a memory in accordance with an embodiment. At 650, a first voltage level is developed in a first semiconductor material forming channel regions for a first grouping of memory cells of a string of series-connected memory cells during an erase operation for that string of series-connected memory cells. The first voltage level might be developed by applying some voltage level to one end of the string of series-connected memory cells (e.g., through a data line connected to the string of series-connected memory cells) while applying some voltage level to the other end of the string of series-connected memory cells (e.g., through a source connected to the string of series-connected memory cells). The voltage levels applied to each end of the string of series-connected memory cells may be the same voltage level.

The first voltage level may further be developed in another semiconductor material forming channel regions for a different grouping of memory cells of the string of series-connected memory cells. For example, the first grouping of memory cells may be those memory cells of the deck of memory cells $250_2$ of FIG. 3B while the different grouping of memory cells might be those memory cells of the deck of memory cells $250_0$ of FIG. 3B. Referring back to the first example discussed with respect to FIG. 5, the first grouping of memory cells may be those memory cells of the deck of memory cells $250_6$, $250_5$ or $250_4$ of FIG. 5 while the different grouping of memory cells might be those memory cells of the deck of memory cells $250_0$, $250_1$ or $250_2$, respectively, of FIG. 5.

At 652, while developing the first voltage level in the first semiconductor material, a second voltage level, less than the first voltage level, is developed in a second semiconductor material forming channel regions for a second grouping of memory cells of the string of series-connected memory cells. Where the first grouping of memory cells includes those memory cells of the deck of memory cells $250_2$ of FIG. 3B, the second grouping of memory cells might be those memory cells of the deck of memory cells $250_1$ of FIG. 3B. Similarly, referring back to the first example discussed with respect to FIG. 5, where the first grouping of memory cells may be those memory cells of the deck of memory cells $250_6$, $250_5$ or $250_4$ of FIG. 5, the second grouping of memory cells might be those memory cells of any of the decks of memory cells $250_1$-$250_5$, those memory cells of any of the decks of memory cells $250_2$-$250_4$ or those memory cells of the deck of memory cells $250_3$, respectively, of FIG. 5. The second voltage level may further be developed in another semiconductor material forming channel regions for a different grouping of memory cells of the string of series-connected memory cells.

At 654, while developing the first voltage level in the first semiconductor material and while developing the second voltage level in the second semiconductor material, a third voltage level is applied to control gates of the first grouping of memory cells and a fourth voltage level, less than the third voltage level, is applied to control gates of the second grouping of memory cells. Where the first voltage level is developed in the semiconductor material forming channel regions for a different grouping of memory cells, the third voltage may further be concurrently applied to control gates of that different grouping of memory cells. Where the second voltage level is developed in the semiconductor material forming channel regions for a different grouping of memory cells, the fourth voltage may further be concurrently applied to control gates of that different grouping of memory cells. Additional voltage levels may further be developed in other semiconductor materials forming channel regions for other groupings of memory cells.

Due to process variations, architecture or otherwise, even where the same voltage level is intended to be applied to a number of different nodes (e.g., to different control gates), the actual applied voltages may represent a range of voltages. For some embodiments, the third voltage level may represent a first range of voltage levels and the fourth voltage level may represent a second range of voltage levels. For such an embodiment, the first range of voltage levels and the second range of voltage levels may represent mutually exclusive ranges of voltage levels where each voltage level of the second range of voltage levels is less than each voltage level of the first range of voltage levels.

Figure 7:
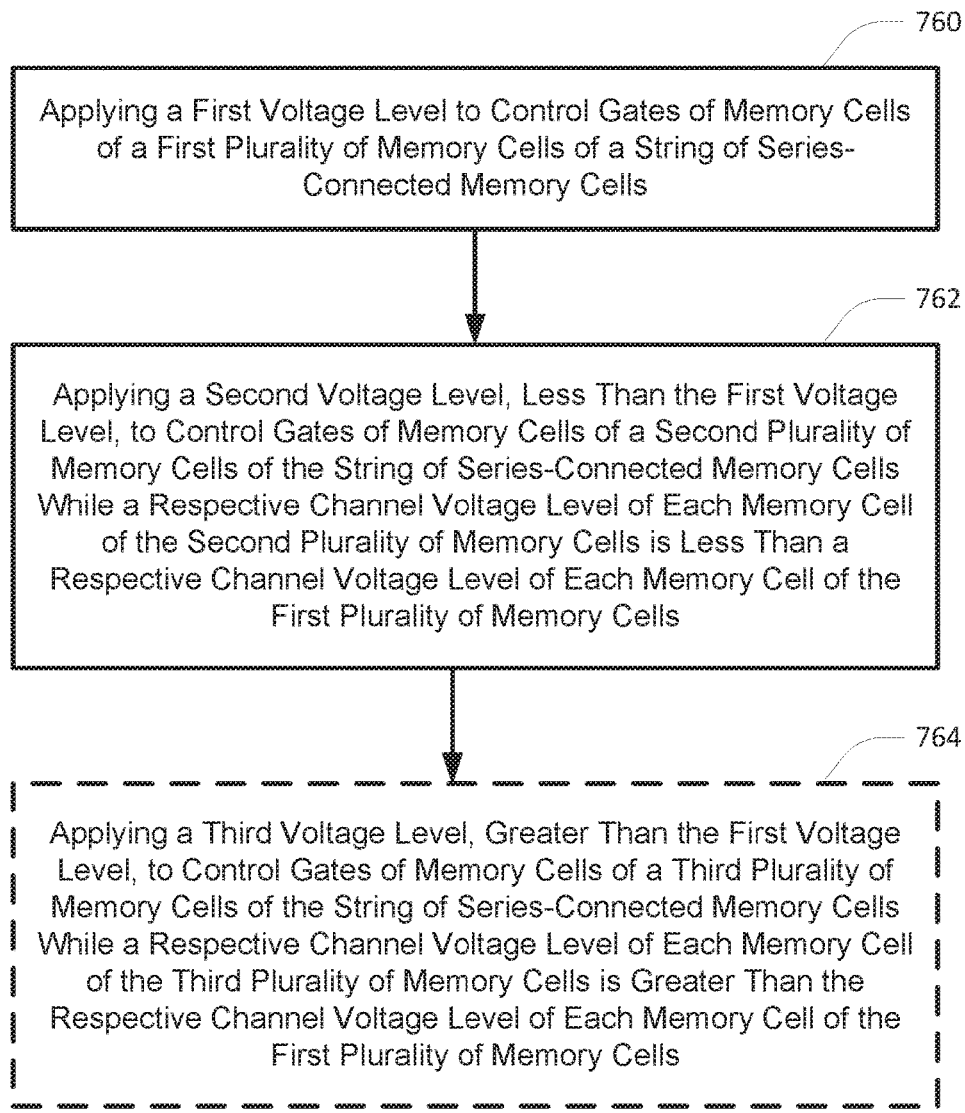
FIG. 7 is a flowchart of a method of operating a memory in accordance with an embodiment.

FIG. 7 is a flowchart of a method of operating a memory in accordance with an embodiment. At 760, a first voltage level is applied to control gates of memory cells of a first plurality of memory cells of a string of series-connected memory cells. The first plurality of memory cells may include a grouping of memory cells sharing a common pillar section, e.g., a deck of memory cells of the string of series-connected memory cells. The first plurality of memory cells may further include one or more (e.g., two)

decks of memory cells of the string of series-connected memory cells and may be a member of respective pluralities of memory cells of a plurality of strings of series-connected memory cells containing the string of series-connected memory cells.

At 762, a second voltage level, less than the first voltage level, is applied to control gates of memory cells of a second plurality of memory cells of the string of series-connected memory cells while a respective channel voltage level of each memory cell of the second plurality of memory cells is less than a respective channel voltage level of each memory cell of the first plurality of memory cells. The second plurality of memory cells may include a grouping of memory cells sharing a common pillar section, e.g., a deck of memory cells of the string of series-connected memory cells. The second plurality of memory cells may further include one or more (e.g., two) decks of memory cells of the string of series-connected memory cells and may be a member of respective pluralities of memory cells of a plurality of strings of series-connected memory cells containing the string of series-connected memory cells.

Optionally, at 764, a third voltage level, greater than the first voltage level, is applied to control gates of memory cells of a third plurality of memory cells of the string of series-connected memory cells while a respective channel voltage level of each memory cell of the third plurality of memory cells is greater than a respective channel voltage level of each memory cell of the first plurality of memory. The third plurality of memory cells may include a grouping of memory cells sharing a common pillar section, e.g., a deck of memory cells of the string of series-connected memory cells. The second plurality of memory cells may further include one or more (e.g., two) decks of memory cells of the string of series-connected memory cells and may be a member of respective pluralities of memory cells of a plurality of strings of series-connected memory cells containing the string of series-connected memory cells. As discussed with respect to FIG. 6, the different voltage levels of FIG. 7 may represent mutually-exclusive ranges of voltage levels.

Figure 8:
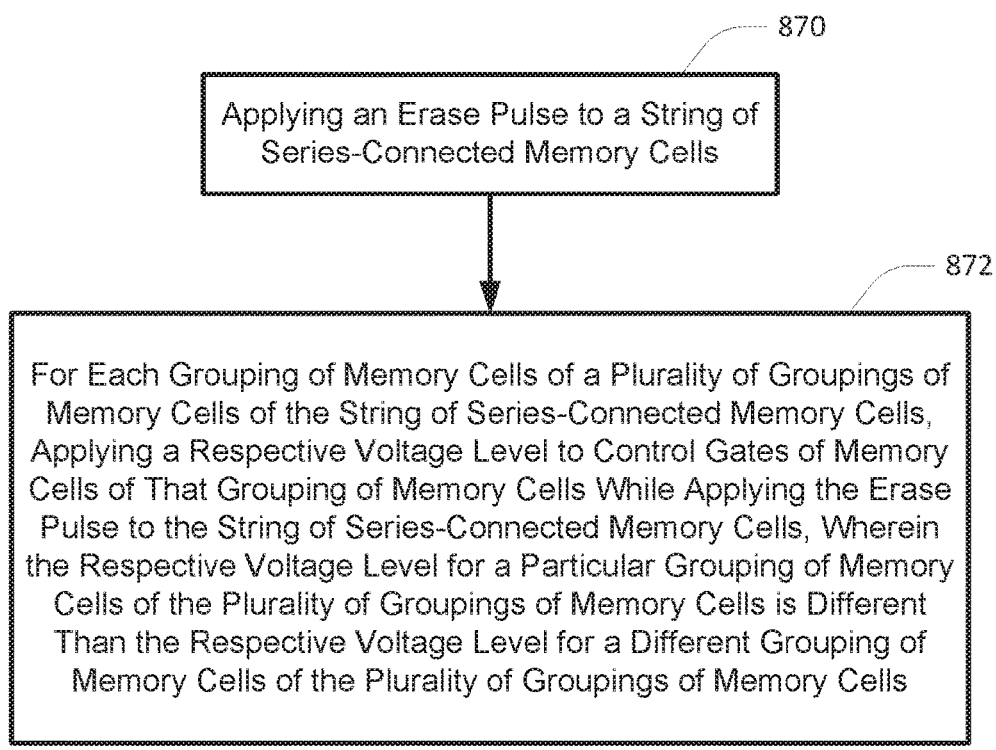
FIG. 8 is a flowchart of a method of operating a memory in accordance with an embodiment.

FIG. 8 is a flowchart of a method of operating a memory in accordance with an embodiment. At 870, an erase pulse is applied to a string of series-connected memory cells, e.g., voltages are applied to opposing ends of the string of series-connected memory cells. For example, an erase voltage may be applied to a data line and a source each commonly connected to a string of series-connected memory cells. At 872, a respective voltage level is applied to control gates of memory cells for each grouping of memory cells of a plurality of groupings of memory cells of the string of series-connected memory cells while applying the erase pulse to the string of series-connected memory cells. The respective voltage level for a particular grouping of memory cells is different than the respective voltage level for a different grouping of memory cells. For example, the respective voltage level for the particular grouping of memory cells may be greater than the respective voltage level for a different grouping of memory cells having an expected channel voltage level less than the expected channel voltage level of the particular grouping of memory cells. As a further example, the respective voltage level for the particular grouping of memory cells may be less than the respective voltage level for a different grouping of memory cells having an expected channel voltage level greater than the expected channel voltage level of the particular grouping of memory cells. In addition, the respective voltage level for the particular grouping of memory cells may by the same as another grouping of memory cells having an expected channel voltage level substantially equal to (e.g., equal to) the expected channel voltage level of the particular grouping of memory cells. As discussed with respect to FIG. 6, the different voltage levels of FIG. 8 may represent mutually-exclusive ranges of voltage levels.

Figure 9:
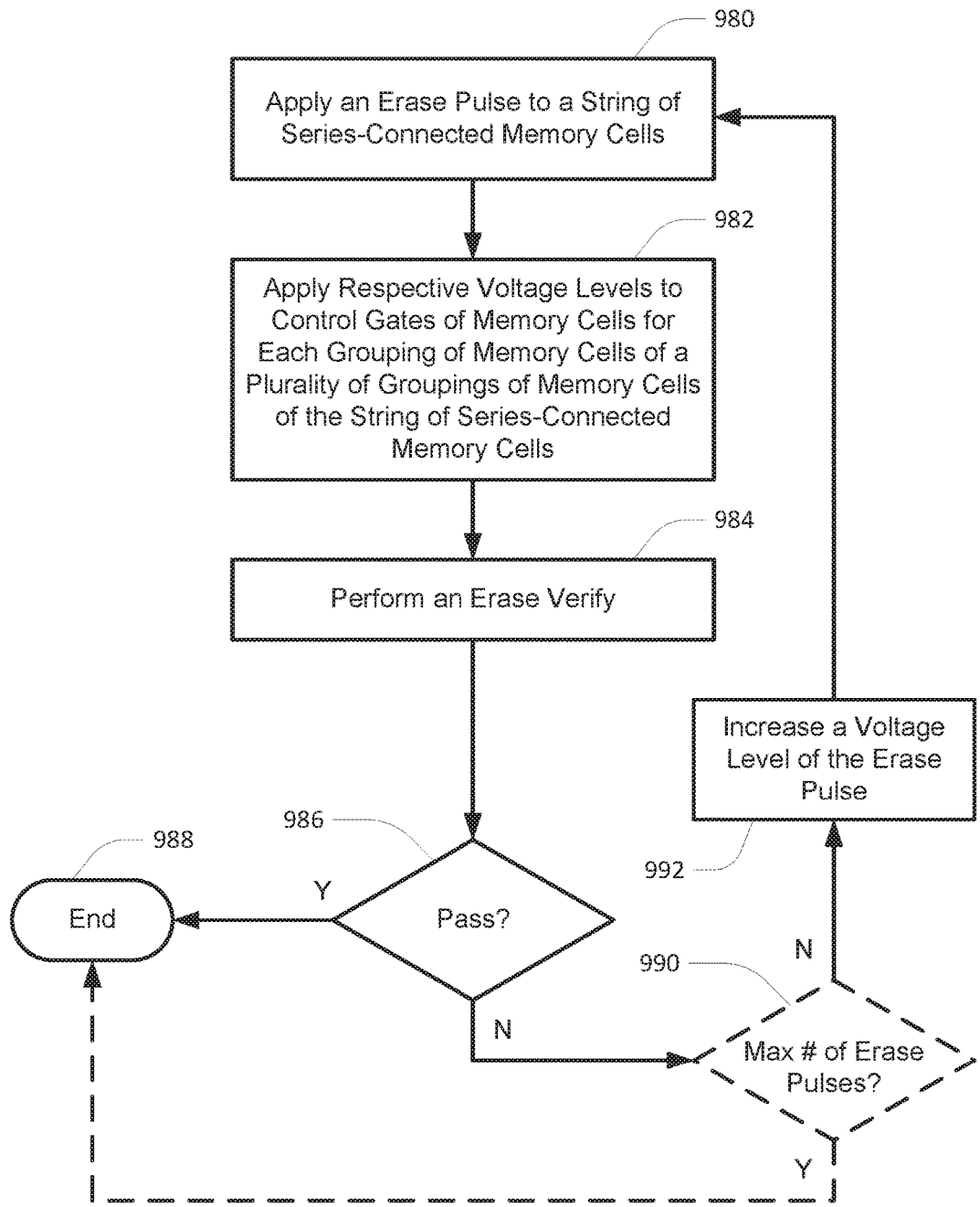
FIG. 9 is a flowchart of a method of operating a memory in accordance with an embodiment.

FIG. 9 is a flowchart of a method of operating a memory, e.g., a method of performing an erase operation on the memory, in accordance with an embodiment. At 980, an erase pulse is applied to a string of series-connected memory cells. For example, an erase voltage might be applied to each end of the string of series-connected memory cells, such as through a data line and source such as discussed with respect to reference number 870 of FIG. 8. At 982, respective voltage levels are applied to control gates of memory cells for each grouping of memory cells of a plurality of groupings of memory cells of the string of series-connected memory cells. For example, respective voltage levels could be applied such as discussed with respect to reference number 872 of FIG. 8. The resulting voltage different across each memory cell (e.g., gate to body/channel) of the string of series-connected memory cells is configured to erase those memory cells (e.g., through removal of electrons from the data-storage structures of the memory cells)

At 984, an erase verify is performed to determine whether each memory cell of the string of series-connected memory cells has been successfully erased (e.g., whether sufficient electrons have been removed to place the threshold voltages of those memory cells at or below a desired threshold voltage level). At 986, a decision is made whether the erase verify passes, i.e., whether the erase operation is successful. If the erase verify passes, the process can end at 988. If not, a decision may be made whether a maximum number of erase pulses has been applied to the string of series-connected memory cells at 990. If the maximum number of erase pulses has not been applied, or if 990 is eliminated, a voltage level of the erase pulse may be increased at 992 before applying another erase pulse at 980 to repeat the process. Despite increasing the voltage level of the erase pulse, the respective voltage levels for each of the groupings of memory cells may maintain their values for subsequent erase pulses.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method of operating a memory, comprising:
applying a first voltage level to a first voltage node electrically connected to a first end of a string of series-connected memory cells;
applying a second voltage level to a second voltage node electrically connected to a second end of the string of series-connected memory cells;
applying a third voltage level to a control gate of a first memory cell of the string of series-connected memory cells while applying the first voltage level to the first voltage node and while applying the second voltage level to the second voltage node, wherein the third voltage level is less than the first voltage level and less than the second voltage level; and applying a fourth voltage level to a control gate of a second memory cell of the string of series-connected memory cells while applying the third voltage level to the control gate of the first memory cell, wherein the fourth voltage level is less than the third voltage level, and wherein the first memory cell is closer to the first voltage node than the second memory cell.

2. The method of claim 1, wherein the string of series-connected memory cells comprises a plurality of diode drops, wherein applying the third voltage level to the control gate of the first memory cell comprises applying the third voltage level to a control gate of a memory cell of the string of series-connected memory cells that is electrically connected to the first voltage node without any intervening diode drops of the plurality of diode drops, and wherein applying the fourth voltage level to the control gate of the second memory cell comprises applying the fourth voltage level to a control gate of a memory cell of the string of series-connected memory cells that is electrically connected to the first voltage node through one diode drop of the plurality of diode drops.

3. The method of claim 1, further comprising:
applying a fifth voltage level to a control gate of a third memory cell of the string of series-connected memory cells while applying the third voltage level to the control gate of the first memory cell;
wherein the second memory cell is closer to the first voltage node than the third memory cell; and
wherein the fifth voltage level is less than the fourth voltage level.

4. The method of claim 1, further comprising:
applying a fifth voltage level to a control gate of a third memory cell of the string of series-connected memory cells while applying the third voltage level to the control gate of the first memory cell;
wherein the second memory cell is closer to the first voltage node than the third memory cell; and
wherein the fifth voltage level is greater than or equal to the fourth voltage level.

5. The method of claim 4, further comprising:
wherein applying the fifth voltage level to the control gate of the third memory cell comprises applying a voltage level equal to the fourth voltage level;
wherein the string of series-connected memory cells comprises a plurality of diode drops;
wherein a particular number of diode drops of the plurality of diode drops are between the second memory cell and the first voltage node;
wherein the particular number of diode drops of the plurality of diode drops are between the third memory cell and the second voltage node; and
wherein the first voltage level and the second voltage level are a same voltage level.

6. The method of claim 4, further comprising:
wherein applying the fifth voltage level to the control gate of the third memory cell comprises applying a voltage level equal to the third voltage level;
wherein the string of series-connected memory cells comprises a plurality of diode drops;
wherein a particular number of diode drops of the plurality of diode drops are between the first memory cell and the first voltage node;
wherein the particular number of diode drops of the plurality of diode drops are between the third memory cell and the second voltage node; and
wherein the first voltage level and the second voltage level are a same voltage level.

7. The method of claim 4, further comprising:
wherein applying the fifth voltage level to the control gate of the third memory cell comprises applying a voltage level greater than the third voltage level;
wherein the string of series-connected memory cells comprises a plurality of diode drops;
wherein a particular number of diode drops of the plurality of diode drops are between the first memory cell and the first voltage node;
wherein a number of diode drops of the plurality of diode drops between the third memory cell and the second voltage node is less than the particular number; and
wherein the first voltage level and the second voltage level are a same voltage level.

8. A method of operating a memory, comprising:
applying a first voltage level to a first voltage node electrically connected to a first end of a string of series-connected memory cells, wherein the string of series-connected memory cells is arranged as a plurality of groupings of series-connected memory cells, with each grouping of series-connected memory cells of the plurality of groupings of series-connected memory cells electrically connected to an adjacent grouping of series-connected memory cells of the plurality of groupings of series-connected memory cells through a respective diode drop of a plurality of diode drops;
applying a second voltage level to a second voltage node electrically connected to a second end of the string of series-connected memory cells; and
while applying the first voltage level to the first voltage node and applying the second voltage level to the second voltage node:
applying a third voltage level, less than the first voltage level and less than the second voltage level, to a respective control gate of each memory cell of the string of series-connected memory cells electrically connected to the first voltage node through a number of diode drops of the plurality of diode drops equal to a first integer value; and
applying a fourth voltage level, less than the third voltage level, to a respective control gate of each memory cell of the string of series-connected memory cells electrically connected to the first voltage node through a number of diode drops of the plurality of diode drops equal to a second integer value that is one greater than the first integer value.

9. The method of claim 8, further comprising:
applying the third voltage level to a respective control gate of each memory cell of the string of series-connected memory cells electrically connected to the second voltage node through a number of diode drops of the plurality of diode drops equal to the first integer value; and
applying the fourth voltage level to a respective control gate of each memory cell of the string of series-connected memory cells electrically connected to the second voltage node through a number of diode drops of the plurality of diode drops equal to the second integer value.

10. The method of claim 9, wherein applying the fourth voltage level to the respective control gate of each memory cell of the string of series-connected memory cells electrically connected to the first voltage node through a number of diode drops of the plurality of diode drops equal to the second integer value and applying the fourth voltage level to a respective control gate of each memory cell of the string of series-connected memory cells electrically connected to the second voltage node through a number of diode drops of the plurality of diode drops equal to the second integer value comprises applying the fourth voltage level to the respective control gate of each memory cell of a single grouping of memory cells of the plurality of groupings of memory cells.

11. The method of claim 8, further comprising:
applying a fifth voltage level, less than the fourth voltage level, to a respective control gate of each memory cell of the string of series-connected memory cells electrically connected to the first voltage node through a number of diode drops of the plurality of diode drops equal to a third integer value that is one greater than the second integer value.

12. The method of claim 11, further comprising:
applying the third voltage level to a respective control gate of each memory cell of the string of series-connected memory cells electrically connected to the second voltage node through a number of diode drops of the plurality of diode drops equal to the first integer value;
applying the fourth voltage level to a respective control gate of each memory cell of the string of series-connected memory cells electrically connected to the second voltage node through a number of diode drops of the plurality of diode drops equal to the second integer value; and
applying the fifth voltage level to a respective control gate of each memory cell of the string of series-connected memory cells electrically connected to the second voltage node through a number of diode drops of the plurality of diode drops equal to the third integer value.

13. The method of claim 12, wherein applying the first voltage level to the first voltage node and applying the second voltage level to the second voltage node comprises applying a same voltage level to the first voltage node and to the second voltage node.

14. The method of claim 8, wherein applying the third voltage level to the respective control gate of each memory cell of the string of series-connected memory cells electrically connected to the first voltage node through a number of diode drops of the plurality of diode drops equal to the first integer value comprises applying the third voltage level to the respective control gate of each memory cell of the string of series-connected memory cells electrically connected to the first voltage node through zero diode drops.

15. The method of claim 8, wherein applying the fourth voltage level to the respective control gate of each memory cell of the string of series-connected memory cells electrically connected to the first voltage node through a number of diode drops of the plurality of diode drops equal to the second integer value comprises memory cells of the string of series-connected memory cells that are also electrically connected to the second voltage node through a number of diode drops of the plurality of diode drops equal to a third integer value greater than or equal to the second integer value.

16. The method of claim 8, further comprising:
applying a fifth voltage level, greater than the third voltage level, to a respective control gate of each memory cell of the string of series-connected memory cells electrically connected to the first voltage node without any intervening diode drops of the plurality of diode drops.

17. The method of claim 8, wherein the plurality of diode drops has an integer value N number of diode drops, the method further comprising:
for each integer value for X greater than or equal to zero and less than or equal to N/2, applying a corresponding voltage level to a respective control gate of each memory cell of the string of series-connected memory cells electrically connected to the first voltage node through a number of diode drops of the plurality of diode drops equal to X and to a respective control gate of each memory cell of the string of series-connected memory cells electrically connected to the second voltage node through a number of diode drops of the plurality of diode drops equal to X;
wherein the corresponding voltage level for a particular integer value for X is different than the corresponding voltage level for any other integer value for X.

18. The method of claim 17, wherein a number of memory cells of the string of series-connected memory cells electrically connected to the first voltage node through zero diode drops is greater than or equal to zero, and wherein a number of memory cells of the string of series-connected memory cells electrically connected to the second voltage node through zero diode drops is greater than or equal to zero.

19. The method of claim 18, wherein the number of memory cells of the string of series-connected memory cells electrically connected to the first voltage node through zero diode drops is greater than the number of memory cells of the string of series-connected memory cells electrically connected to the second voltage node through zero diode drops.

20. The method of claim 8, wherein applying the third voltage level to the respective control gate of each memory cell of the string of series-connected memory cells electrically connected to the first voltage node through a number of diode drops of the plurality of diode drops equal to the first integer value and applying the fourth voltage level to the respective control gate of each memory cell of the string of series-connected memory cells electrically connected to the first voltage node through a number of diode drops of the plurality of diode drops equal to the second integer value comprises applying the third voltage level and applying the fourth voltage level to a different number of control gates.

21. An apparatus, comprising:
a string of series-connected memory cells;
a first voltage node selectively electrically connected to a first end of the string of series-connected memory cells;
a second voltage node selectively electrically connected to a second end of the string of series-connected memory cells; and
a controller, wherein the controller is configured to:
apply a first voltage level to the first voltage node while electrically connected to the first end of the string of series-connected memory cells;
apply a second voltage level to the second voltage node while electrically connected to the second end of the string of series-connected memory cells;
apply a third voltage level to a control gate of a first memory cell of the string of series-connected memory cells while applying the first voltage level to the first voltage node and while applying the second voltage level to the second voltage node, wherein the third voltage level is less than the first voltage level and less than the second voltage level; and
apply a fourth voltage level to a control gate of a second memory cell of the string of series-connected memory cells while applying the third voltage level to the control gate of the first memory cell, wherein the fourth voltage level is less than the third voltage level, and wherein the first memory cell is closer to the first voltage node than the second memory cell.

22. The apparatus of claim 21, wherein the string of series-connected memory cells is arranged as a plurality of groupings of series-connected memory cells, with each grouping of series-connected memory cells of the plurality of groupings of series-connected memory cells electrically connected to an adjacent grouping of series-connected memory cells of the plurality of groupings of series-connected memory cells through a respective diode drop of a plurality of diode drops, and wherein the controller is further configured to:

apply the third voltage level to the control gate of the first memory cell and to a respective control gate of each remaining memory cell of the string of series-connected memory cells electrically connected to the first voltage node through a number of diode drops of the plurality of diode drops equal to a first integer value; and apply the fourth voltage level to the control gate of the second memory cell and to a respective control gate of each remaining memory cell of the string of series-connected memory cells electrically connected to the first voltage node through a number of diode drops of the plurality of diode drops equal to a second integer value that is one greater than the first integer value.

\* \* \* \* \*